United States Patent [19]

De Sa

[11] 4,438,389

[45] Mar. 20, 1984

[54] METHOD FOR UTILIZING THREE-DIMENSIONAL RADIATED MAGNETIC FIELD GRADIENTS FOR DETECTING SERVING FAULTS IN BURIED CABLES

[75] Inventor: Alten J. A. De Sa, Gosforth, England

[73] Assignee: Geodate Limited, England

[21] Appl. No.: 179,278

[22] Filed: Aug. 15, 1980

[30] Foreign Application Priority Data

Aug. 18, 1979 [GB] United Kingdom ................. 7928837
Aug. 22, 1979 [GB] United Kingdom ................. 7929258

[51] Int. Cl.³ .......................... G01R 31/08; G01V 3/11
[52] U.S. Cl. .......................................... 324/52; 324/54; 324/326
[58] Field of Search ................... 324/52, 54, 67, 326, 324/345

[56] References Cited

U.S. PATENT DOCUMENTS

| | | | |
|---|---|---|---|
| 1,297,929 | 3/1919 | Taylor | 324/52 |
| 2,427,666 | 9/1947 | Felch et al. | 324/345 X |
| 3,568,048 | 3/1971 | Robinson | 324/345 |
| 3,745,452 | 7/1973 | Osburn et al. | 324/52 X |
| 3,792,350 | 2/1974 | Bossler et al. | 324/52 |
| 4,095,169 | 6/1978 | Muse | 324/345 |
| 4,134,061 | 1/1979 | Gudgel | 324/52 X |
| 4,220,913 | 9/1980 | Howell et al. | 324/52 |

FOREIGN PATENT DOCUMENTS

| | | | |
|---|---|---|---|
| 219493 | 4/1957 | Australia | 324/52 |
| 1791027 | 4/1979 | Fed. Rep. of Germany | 324/52 |
| 2289919 | 7/1976 | France | 324/52 |
| 2389139 | 12/1978 | France | 324/52 |
| 577080 | 5/1946 | United Kingdom | 324/52 |
| 1509914 | 5/1978 | United Kingdom | 324/326 |

Primary Examiner—Gerard R. Strecker
Attorney, Agent, or Firm—James E. Nilles

[57] ABSTRACT

A signal of a predetermined frequency is injected into the served (insulated) sheath of an underground cable and the resultant magnetic $\bar{H}$ field generated is monitored using two pick-up coils 62 and 63 aligned along the length of the cable. The phase difference between the emfs induced in the two coils is a measure of the $\bar{H}$ field gradient and a sharp change in phase accompanied by a change in emf. magnitude indicates a fault. The same two coils turned through 90° transversely to the cable can be used to locate the cable by scanning transversely to the cable. As the coils pass over the cable the relative phase of the induced emf signals in the coils reverses. Alternatively, three or four coils may be used arranged in two orthogonal pairs with the coils of one pair being aligned in use along the cable and the coils of the other pair transverse to the cable.

10 Claims, 9 Drawing Figures

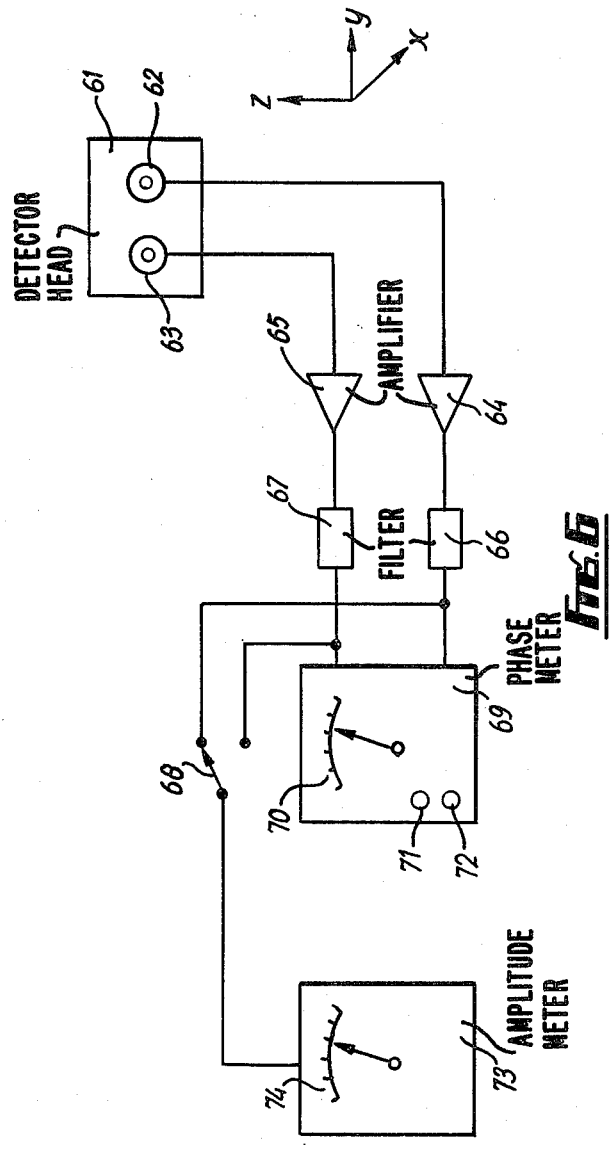

METHOD FOR UTILIZING THREE-DIMENSIONAL RADIATED MAGNETIC FIELD GRADIENTS FOR DETECTING SERVING FAULTS IN BURIED CABLES

The present invention relates to a method of, and apparatus for, locating an electrical current carrying element, for example in a subterranean location, and, particularly where the element is the served (i.e. insulated) sheath of an electric cable, for detecting the presence of a fault or of any deterioration therein.

Synthetic plastics covered (served) aluminium sheaths can become extensively damaged by corrosion when the sheath comes in contact with water and soil as a result of a failure in the serving. The normal ohmic resistance of the sheath to earth is typically of order 4 to 8 M$\Omega$. When this resistance is $\leq 0.5$ M$\Omega$ it means there is an electrically conducting path which is a result of sheath insulation (serving) breakdown at one or more points along the length of the cable. Such breakdown can be caused by pin-holes, cracks or mechanical damage in the plastic serving, often in places where two cables are joined. Ultimately the electric cable will become damaged and it is essential therefore that a fault in the served sheath is detected at an early stage. The present invention enables a fault in the serving to be located even before any damage to the sheath has occurred, as well as enabling sheath faults to be located.

Underground power cables in the United Kingdom include E.H.V. (extra high voltage) all insulated routes which are usually buried to a depth of 1 to 2 meters. Physical considerations preclude the use of techniques such as Pulse Reflectometry for fault finding whilst other existing methods require a power source of high voltage (typically 2 KVA or more). These methods sample the ELECTRIC FIELD generated by the applied potential difference with contact or capacitively coupled electrodes.

According to one aspect of the present invention, there is provided a method of monitoring the performance of an elongate electrically conductive cable sheath and its serving, including the steps of injecting a signal of pre-determined frequency into the sheath, and examining the profile in amplitude and/or gradient of the resulting magnetic $\vec{H}$ field.

The profile of the magnetic $\vec{H}$ field can be examined from one side to the other of the sheath (TRANSVERSE mode) in order to locate the sheath or along the sheath (LONGITUDINAL mode) in order to determine the position of a serving fault.

In practice earth links at both ends of the sheath will be removed and the signal injected at either end although if only one link is removed the signal may be injected at the same end. However, if it is not possible to remove either link the signal can be injected at an intermediate point along the sheath.

According to another aspect of the present invention, there is provided apparatus for examining the profile in amplitude and/or gradient of a magnetic $\vec{H}$ field comprising two coils arranged in fixed relationship to each other in the same plane and amplitude and phase difference monitoring devices for respectively indicating the amplitude of emfs induced in the coils due to the magnetic field and indicating the difference in phase between the emfs induced in those coils.

According to a further aspect of the present invention, there is provided apparatus for examining the profile in amplitude and/or gradient of a MAGNETIC $\vec{H}$ field comprising three coils disposed in a plane in two pairs with the coils of each pair arranged in a fixed relationship to each other and with the coils being disposed with their centres on the vertices of a right angled triangle.

If desired, four coils could be provided arranged in two pairs with the line joining the centres of the coil of one pair orthogonal to the line joining the centres of coils of the second pair.

The term injecting is used to cover both direct and indirect coupling between the cables sheath and the source of the signal. Thus, for example, the coupling, when direct, may be a direct electrical connection and, when indirect, may be inductive or capacitive.

In order that the invention may be clearly understood, a number of embodiments thereof will now be described, by way of example, with reference to the accompanying drawings, in which.

Figure 2:
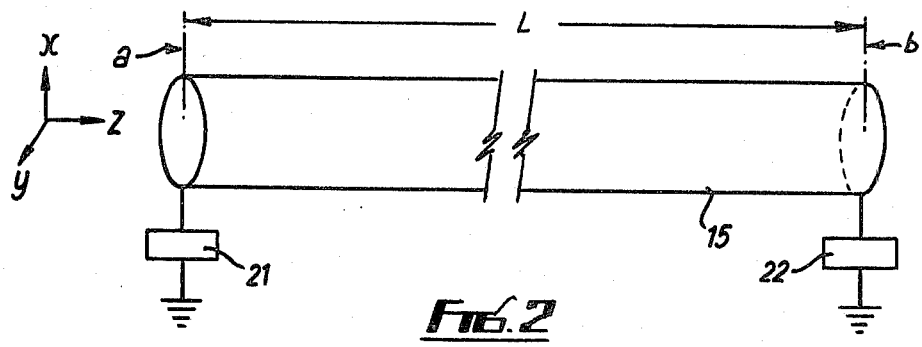
FIG. 2 shows a side-view of the cable sheath.
Figure 3:
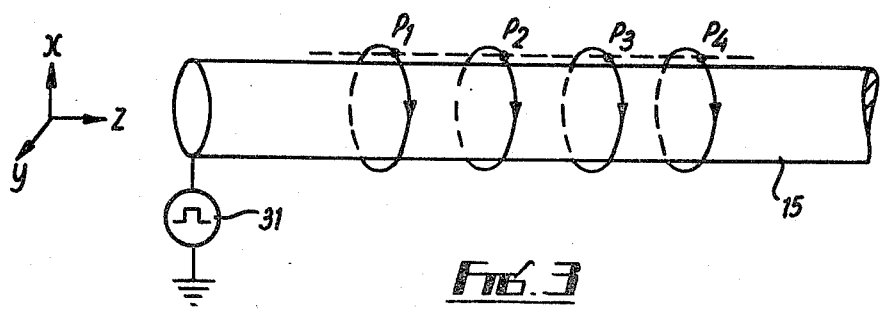

FIG. 3 diagrammatically shows the magnetic field surrounding a cable sheath of the type shown in FIG. 2 when the earth links are removed and an input signal injected at the left-hand end of the sheath.

Figure 4:
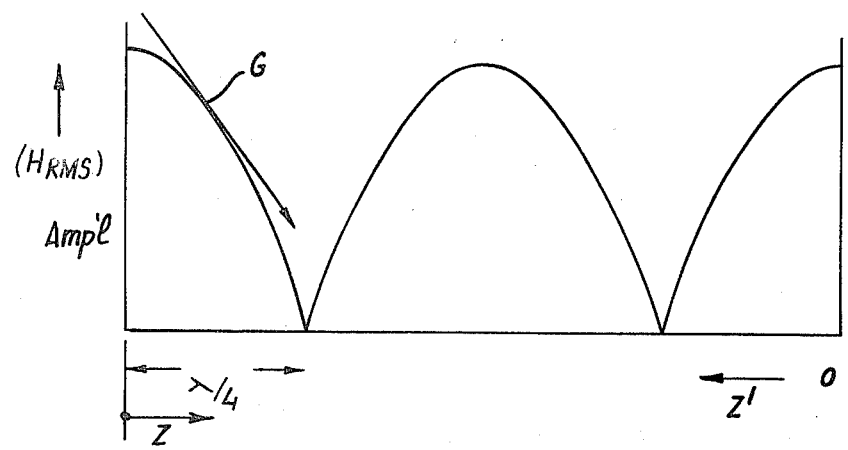

FIG. 4 shows a standing wave generated on a short circuited transmission line which is long compared with the wavelength.

Figure 5:
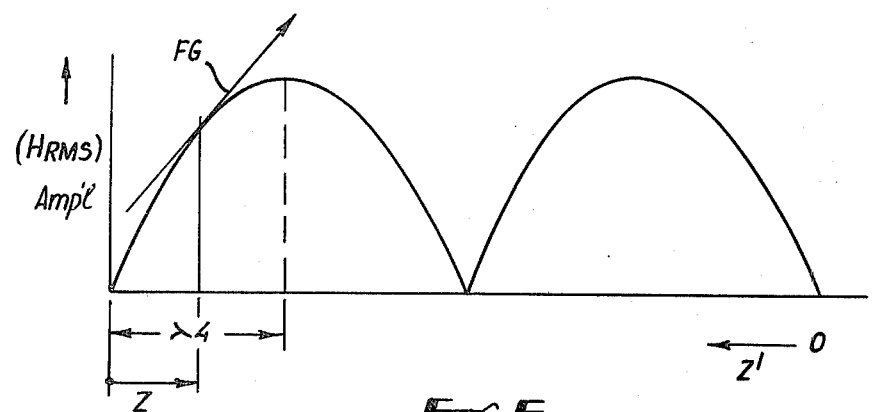

FIG. 5 shows a standing wave generated on an open circuited transmission line which is long compared with the wavelength.

FIG. 6 shows a block diagram of a detector for monitoring the amplitude and sign of an A.C. magnetic field gradient.

Figure 7A:
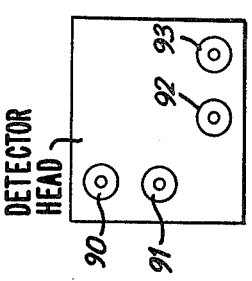
Figure 7:
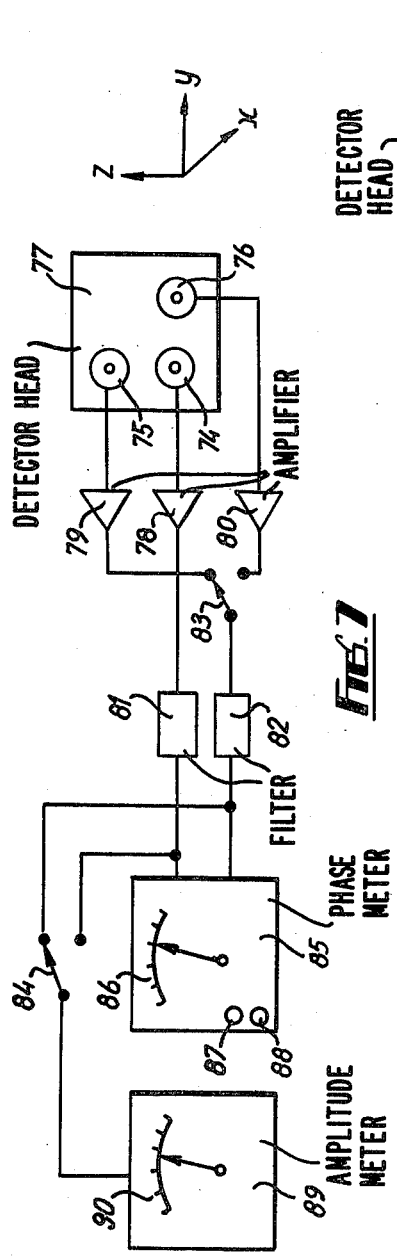

FIG. 7 shows a modification of the detector shown in FIG. 6.

FIG. 7a shows another modification of the detector shown in FIG. 6, and

Figure 8:
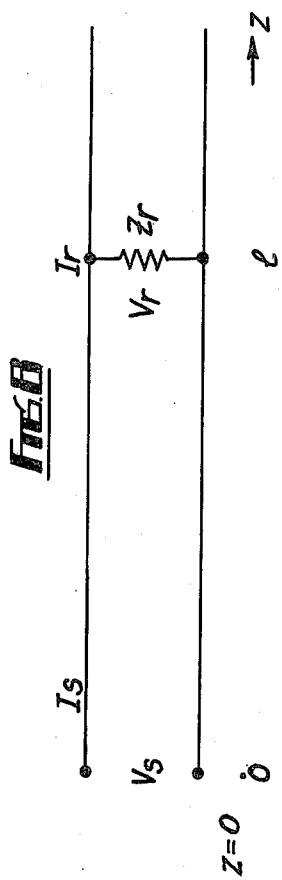

FIG. 8 shows a uniform two conductor transmission line with associated parameters which is an approximation of the hollow cable sheath excited at one end at a single frequency.

Figure 1:
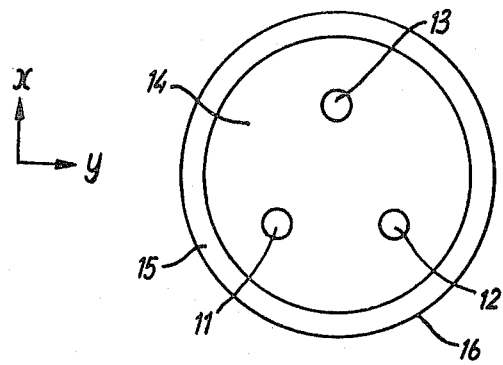
FIG. 1 shows diagrammatically a cross-section of a typical EHV (extra high voltage) underground electricity power cable.

Referring to FIGS. 1 and 2 of the drawings, the standard underground power transmission cable length L between substations (a) and (b) is typically of the order 3 Km. The cable generally comprises three conductors 11, 12 and 13 symmetrically submerged in oil or gas 14 at high pressure contained within a surrounding metal, normally aluminium, sheath 15 with an insulating coating (serving) 16. The sheath 15 is connected to earth at both substations by respective links 21 and 22. When the links are removed, the resistance from the sheath to earth should be of order 4 M$\Omega$ or greater. A value for this resistance of less than 0.5 M$\Omega$ is defined, or classed, as a fault. The fault or faults may be anywhere along the cable length and as the cable can be buried to a depth typically of order 1 to 2 meters, locating the fault simply and accurately is a first preferential step, in the remedy of the fault.

The theory on which the present invention is based is as follows:

If the cable sheath is excited at one end at a single frequency, the only mode that will propagate is the transverse electromagnetic mode (T.E.M.) where z is the direction of propagation and $\vec{E}$ and $\vec{H}$ are respectively the electric and magnetic vectors which are orthogonal in the xy plane.

The line parameters are defined as follows:
L = Inductance per unit length.
C = Capacitance per unit length.
R = Resistance per unit length.
G = Conductance per unit length which is the leakage Conductance of the imperfect dielectric between the conductors.

Rate of change of voltage (v) and current (i) with propagation distance (z) along is given by:

$$\frac{\delta v}{\delta z} = -iR - L\frac{\delta i}{\delta t} \quad (1)$$

$$\frac{\delta i}{\delta z} = -vG - C\frac{\delta v}{\delta t} \quad (2)$$

The general solutions being, for an unmatched line, $$I = I_r \cosh[\gamma(1-Z)] + \frac{V_r}{Z_o}\sinh[\gamma(1-Z)] \quad (3)$$

$$V = V_r \cos h[\gamma(l-Z)] + I_r Z_o \sin h[\gamma(l-Z)] \quad (4)$$

$$i = |V_r|\frac{C}{L}\sin\left(\frac{2\pi Z'}{\lambda}\right)\sin\left(\omega t + \theta_r + \frac{\pi}{2}\right) \quad (5)$$

$$v = |V_r|\cos\left(\frac{2\pi Z'}{\lambda}\right)\sin(\omega t + \theta_r) \quad (6)$$

$$i = |I_r|\cos\left(\frac{2\pi Z'}{\lambda}\right)\sin(\omega t + \theta_r) \quad (7)$$

$$v = |I_r|\sqrt{\frac{L}{C}}\sin\left(\frac{2\pi Z'}{\lambda}\right)\sin\left(\omega t + \theta_r + \frac{\pi}{2}\right) \quad (8)$$

for the short circuit case.
Where
I is the line current
I$v$ is the termination current
V is the line voltage
V$v$ is the termination voltage
l is the length of the line
Z is the distance along the line from the source
Z' is the distance along the line from the termination i.e. Z' = (l-Z)
Z$o$ is the characteristic impedance of the line
Z$v$ is the impedance of the termination
λ is the wavelength
θ$v$ is the phase angle
ω is the angular velocity
t is time
$v$ is the instantaneous voltage
i is the instantaneous current
γ is the propagation constant In the case of a cable the value of R, the resistance per unit length, can be neglected. However, the value of G, the leakage conductance per unit length, is not normally negligible but the effect is one of a smooth and gradual change in amplitudes and phase relationships along the cable. It can therefore be assumed that the system behaves as a loss free line with the effect of actual losses superimposed.

A suitable fault location procedure can now be described. In the following, and all figures, a consistent Cartesian coordinate system is referred to, with the z axis along the length of the buried cable, the x axis vertical, with the ground level above the buried cable parallel to the yz plane.

With links 21 and 22 removed at both substations, an alternating signal is injected into one end of the cable sheath 15. In the present embodiments, for convenience, the injected signal is a square wave with amplitude ±15 volts. In practice the frequency of the injected signal is chosen so that a quareter wavelength is longer than the typical distance between substations. This is not essential but as will be seen later will avoid ambiguous readings due to normally occuring nodes and anti-nodes in the electromagnetic profile.

In the case of the present embodiments the frequency of the injected signal is approximately 5 KHz with corresponding wavelength 60 Km. The quarter wavelength is thus 15 Km which is much larger than the typical distance between substations which is of order 1.5 to 3 Km.

A magnetic $\vec{H}$ field is generated around the cable and this field appears on the surface directly above the buried cable. This field is diagrammatically illustrated in FIG. 3 and is utilised to locate the reference points $P_1$, $P_2$, $P_3$, $P_4$ etc., which lie in the horizontal earth plane above the cable, as well as the position of a fault or faults along the length of the cable's served sheath.

On a good, or fault-free, cable it is similar to the case of an open circuited transmission line and the magnetic $\vec{H}$ field or current profile of the waveform is given by equation (5) and FIG. 5 near the origin. Sin $$\left(\frac{2\pi Z'}{\lambda}\right)$$

is the spatial distribution and Sin. ($\omega t + \theta r + \pi/2$) is the time dependent term responsible for generating an induced E.M.F. in the pick-up coils of the described apparatus embodiments. Two pick-up coils mounted rigidly in a plane, a few centimeters apart, and coupled into the time dependent $\vec{H}$ field will each have an induced E.M.F. proportional to the rate of change of flux and the magnitude of $\vec{H}$. The PHASE DIFFERENCE between the induced E.M.F.s in the two coils is a measure of the spatial gradient FG of $\vec{H}$, the slope of the tangent near the origin in FIG. 5. This slope is smoothly varying and so the phase difference between the induced E.M.F.s in the two coils must be smoothly varying along the length of a fault free cable, provided the coil assembly is coupled at the same position in the toroidal field, say points $P_1$, $P_2$, $P_3$, $P_4$, etc. of FIG. 3.

The points $P_i$ (where i is any integer) on the surface are those of maximum sensitivity and are points of equal phase difference between the induced E.M.F.s in the two coils when mounted rigidly as in FIG. 6 (coils 62 and 63 on assembly 61) and moved in the ±y direction on the surface across the position of the cable (TRANSVERSE scan). The line joining the centre of each coil is also in the ±y direction for this scan mode.

A short circuit along the cable will produce a current maximum given by equation (7) and from FIG. 4 the gradient G of $\vec{H}$, the slope of the tangent, must change sign.

A fault is not necessarily a short circuit but can be a low resistance path. The field gradient therefore varies in shape and a fault is characterised by a change in the magnitude of the induced E.M.F.s accompanied by a sharp change in phase (in the LONGITUDINAL scan). In the LONGITUDINAL scan the coil support 61 is moved in the z direction along the line through the surface points $P_i$. The line joining the centre of each coil 62 and 63 is in the $\pm z$ direction.

The detector 61 comprises two coils 62, 63 each 3.8 cm in diameter in fixed relationship to each other with their centres 4 cm apart. Each coil has a ferrite core, and is tuned to the fundamental frequency of the transmitter. The axis of each coil is in the x direction (based on our previous notation). The detector is also fitted with a spirit level. This detector will sample the $\vec{H}$-field gradient on the surface above the buried cable in both the Transverse and Longitudinal scans.

Respective matched coils 62, 63 are connected to respective ones of a pair of buffer amplifiers 64, 65, which have a matched voltage gain and then through respective mains frequency filters (rejection) 66, 67 to a phase meter 69. The phase meter 69 bears a scale 70 and two lights 71, 72 which respectively indicate, when lit, that the signal from coil 62 leads the signal from coil 63 in phase or vice versa. It is useful to monitor the field strength as well as the magnitude and sign of the field gradient. The signal from each coil in turn can be connected to a peak rectifier 73 with signal amplitude scale 74 by means of a switch 68. The detector head 61 can be fitted with a handle so that the head 61 can be easily kept horizontal in the surface plane by a moving operator during the fault finding or monitoring procedure. The whole apparatus of FIG. 6 can be incorporated on the handle to the detector head 61 or alternatively the control electronics and meters etc. can be in a separate unit and electrically connected to the head/handle unit.

To locate the cable, the operator walks along the cable length with the detector head 61 held out in front and moved from side to side over the estimated cable position to sample the $\vec{H}$-field gradient in magnitude and direction using the information from the phase meter and amplitude meter. As the detector passes over the cable position, the phase meter will indicate a change from coil 62 leads coil 63 to coil 62 lags coil 63, or vice versa, due to the fact that the linkage of the $\vec{H}$-field with the coils alters and with it the E.M.F. induced in the coils. It is thus possible to position the detector head at a point where the toroidal field gradient (transverse mode) is sharpest as at the surface points $P_i$ in FIG. 3. Once the cable has been located and the detector positioned across it, the $\vec{H}$-field gradient can be examined as before along the length of the cable. A node or dip is formed in the overall electromagnetic wave profile at the fault location and the $\vec{H}$-field gradient changes sign. This reversal can be detected by the phasemeter with the head orientated for the longitudinal mode (i.e. the line joining the centre of each coil aligned in the $\pm z$ direction).

In the case of low resistance as opposed to short circuit faults this dip may not be readily apparent but a change in amplitude accompanied by an abrupt change in phase angle indicates the position of the fault. In such cases any change in amplitude alone should be ignored as being caused by local conditions other than cable faults.

In order to verify the existance of a fault the transmitter may be connected to the other end of the cable and a second scan taken in the opposite direction and cross correlation techniques, using pairs of phase readings and pairs of amplitude readings may be used to define accurately the position of the fault. Such verification may be particularly useful, or even necessary, where the fault is relatively small.

A more convenient embodiment is shown in FIG. 7 where the detector head 77 comprises three coils 74, 75, 76 disposed in a horizontal plane at the vertices of an isosceles right angled triangle. This axis of each coil is normal to the horizontal plane. The coil 74 at the vertex containing the right angle is the reference coil. With the orientation shown in FIG. 7 (with the cable in the z direction) coils 74 and 76 are used in the TRANSVERSE scan to locate the surface reference points $P_i$ whilst coils 74 and 75 are used in the LONGITUDINAL scan to examine the field gradient along the cable length. In FIGS. 6 and 7 the x-coordinate of the 3-dimensional coordinate system is vertically out of the page of the drawing.

Respective matched coils 74, 75, 76 are connected to respective buffer amplifiers 78, 79, 80 having a matched voltage gain. The output from 78 passes through mains frequency rejection filter 81. The output from either 79 or 80 passes through mains frequency rejection filter 82 via switch 83. The signals from either coil pair 74, 75 or 74, 76 pass to the phase meter 85 which has scale 86 and lead/lag lights 87, 88 as before. The signal from each coil in turn can be connected to peak rectifier 89 with scale 90 by means of switches 83 and 84. A four coil detector head could also be used in two orthogonal pairs. Four such coils 90 to 93 are shown diagrammatically in FIG. 7a.

In practice the $\vec{H}$-field gradient is sampled near the substation at which the signal is injected and the direction of the detector noted with respect to the cable. Sampling is repeatedly carried out along the length of the cable until the detector indicates a change in sign of the phase angle. The fault lies at that point. Or, in the case of a high resistance fault at the point where a change in amplitude is accompanied by an abrupt change in phase angle.

The method and apparatus of the invention may also be used to determine the depth of good cables and to monitor deterioration of cables and to locate large obstacles underground as their existence modifies the magnetic field.

The method of the invention can also be used on:
insulating conducting pipes,
single insulated cable,
conducting fluids in non-conducting pipes,
conducting or non-conducting fluids in insulated conducting pipes,
unguarded coaxial cables.

It will be appreciated that in contrast to previous fault detection procedures, no electrodes, or indeed any contact with the earth above the faulty cable is necessary.

Only a relatively low voltage signal is required to be injected into the cable sheath thus minimising or eliminating the risk of damage to the sheath from the fault detection procedure itself. The dependance of the method on the $\vec{H}$ component of the generated electromagnetic wave results in a high rejection factor of unwanted signals and the dependence of the method on the measurement of $\vec{H}$-field gradient and phase means that the readings received are independent of amplitude, providing the signal level is adequate.

Furthermore, as the standing wave profile on the line quickly regains its normal form after the fault it is not normally necessary to correct the fault before proceeding to locate the next fault along the line. In fact the standing wave pattern recovery is usually achieved within 20 to 100 meters of a fault. The E.M.F. amplitude generated in the detection will give an indication of the type of fault located.

A modification to the above described method, based on the same general priciples, can be used for locating faults and monitoring the performance, for example, of domestic 3-phase power supply systems, either linked or unlinked, where the frequency of the injected signal is chosen so that the wavelength is short compared with the length of the transmission line in question. In this case a series of nodes and antinodes will be formed in the magnetic $\vec{H}$ field profile along the line, through which the field gradient will change sign. A fault along the line will modify the $\vec{H}$ field profile and will enable the position of the fault to be determined.

The above described methods afford the following important and advantageous features.

(1) Transmission line theory is utilised to locate gradients in the MAGNETIC $\vec{H}$ field component of an electromagnetic wave, in two dimensions.

(2) A high voltage source is not required and thus the risk of a dielectric breakdown at points where the insulation (serving) is partly damaged, is avoided. Some alternative methods involve increasing the severity of the fault by the passage of high currents in order to 'burn' a lower resistance path into the serving thus increasing the sensitivity of the method. However, this can create faults where previously none existed. In the present invention the power requirements are of the order of ±15 volts at 250 mA.

(3) Electrical contacts to the soil around the buried cable are not required. This is particularly useful where the cable is buried under a footpath or road.

(4) The apparatus can be used in electromagnetically noisy environments and is not affected by moving vehicles or large moving metallic objects.

(5) Each fault has a characteristic field profile, and the field profile of a good cable is distinct from a faulty one.

It will also be appreciated that by monitoring a non-faulty cable at regular intervals and comparing the results obtained, any gradual deterioration in the cable can be detected enabling remedial action to be taken at a relatively early stage.

What is claimed is:

1. A method of monitoring the performance of an elongate electrically conductive cable sheath and its serving, including the steps of injecting a signal of predetermined frequency into the sheath, in order to produce a standing wave on the sheath and its serving, and examining the standing wave profile in amplitude and gradient of the resulting magnetic $\vec{H}$ field, to detect a coincident change in amplitude and gradient which is indicative of a fault, comparing the $\vec{H}$ field examined with the $\vec{H}$ field produced by a sheath having no fault, determining the position of distortion in the examined $\vec{H}$ field from that comparison and determining the position of a fault from the position of the distortion.

2. A method of monitoring the performance of an elongate electrically conductive cable sheath and its serving as claimed in claim 1, in which the standing wave profile of the magnetic $\vec{H}$ field is examined from one side to the other of the sheath in order to locate the sheath.

3. A method of monitoring the performance of an elongate electrically conductive cable sheath and its serving as claimed in claim 1, in which the standing wave profile of the magnetic $\vec{H}$ field is examined along the sheath in order to determine the position of a serving fault.

4. A method of monitoring the performance of an elongate electrically conductive cable sheath and its serving as claimed in claim 1, in which, where, as is usual, the serving is connected to earth by earth links at respective ends, at least the link at the end at which the signal is injected is removed prior to signal injection.

5. A method of monitoring the performance of an elongate electrically conductive cable sheath and its serving as claimed in claim 1, in which the signal is injected at a point intermediate the two ends of the cable.

6. A method of monitoring the performance of an elongate electrically conductive cable sheath and its serving as claimed in claim 1, in which signal injection is achieved by means of a direct electrical connection of signal injection means with the cable sheath.

7. A method of monitoring the performance of an elongate electrically conductive cable sheath and its serving as claimed in claim 1, in which signal injection is achieved by means of an indirect coupling between the sheath and the signal injection means.

8. A method of monitoring the performance of an elongate electrically conductive cable sheath and its serving as claimed in claim 7, in which the indirect coupling is capacitive.

9. A method of monitoring the performance of an elongate electrically conductive cable sheath and its serving as claimed in claim 7, in which the indirect coupling is inductive.

10. A method of monitoring the performance of an elongate electrically conductive cable sheath and its serving as claimed in claim 1, in which the predetermined frequency of the injected signal is chosen so that its wavelength is at least four times the distance of the line being monitored between substations.

* * * * *